(12) United States Patent
Lowrey

(10) Patent No.: US 6,246,604 B1
(45) Date of Patent: Jun. 12, 2001

(54) MEMORY ARRAY ARCHITECTURE, METHOD OF OPERATING A DYNAMIC RANDOM ACCESS MEMORY, AND METHOD OF MANUFACTURING A DYNAMIC RANDOM ACCESS MEMORY

(75) Inventor: Tyler A. Lowrey, Sandpoint, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/353,307

(22) Filed: Jul. 14, 1999

(51) Int. Cl.$^7$ .................................................. G11C 11/24
(52) U.S. Cl. ........................ 365/149; 365/205; 365/203; 365/202
(58) Field of Search ................................... 365/149, 205, 365/203, 202

(56) References Cited

U.S. PATENT DOCUMENTS

| | | | |
|---|---|---|---|
| 5,610,868 | * 3/1997 | Inaba et al. ........................... | 365/205 |
| 5,831,895 | 11/1998 | Manning . | |
| 5,841,691 | 11/1998 | Fink . | |
| 5,862,072 | 1/1999 | Raad et al. . | |
| 5,862,089 | 1/1999 | Raad et al. . | |
| 6,094,391 | * 7/2000 | Pinney .................................. | 365/203 |
| 6,141,270 | * 10/2000 | Casper ............................. | 365/149 X |

\* cited by examiner

*Primary Examiner*—Huan Hoang
(74) *Attorney, Agent, or Firm*—Wells, St. Johns, Roberts, Gregory & Matkin, P.S.

(57) ABSTRACT

A dynamic random access memory includes a plate line; a digit line; a memory cell selectively coupled between the digit line and the plate line; sense circuitry selectively coupled to the memory cell to read the memory cell and capable of applying a first voltage from the plate line to the digit line; equilibration circuitry selectively coupling the plate line to an equilibration voltage less than the first voltage and selectively coupling the digit line to the equilibration voltage; and control circuitry configured to cause the equilibration circuitry to couple the plate line to the equilibration voltage while the memory cell is being accessed. A method of manufacturing a dynamic random access memory includes providing control circuitry configured to operate in a specified manner. A method of operating a dynamic random access memory includes turning on one equilibration transistor, while another equilibration transistor is off, so that a plate line equilibrates to a voltage defined by the equilibration voltage source during accessing of a memory cell.

42 Claims, 3 Drawing Sheets

MEMORY ARRAY ARCHITECTURE, METHOD OF OPERATING A DYNAMIC RANDOM ACCESS MEMORY, AND METHOD OF MANUFACTURING A DYNAMIC RANDOM ACCESS MEMORY

TECHNICAL FIELD

The invention relates to memory devices. More particularly, the invention relates to memory array architectures and to dynamic cell plate sensing.

BACKGROUND OF THE INVENTION

A DRAM memory cell includes a MOS access transistor and a storage capacitor. The access transistor is located between the memory cell capacitor and a digit line. The digit line is coupled to a plurality of memory cell transistors. Typically, either metal or polysilicon is used to form the digit line. The memory cell holds one bit of binary information, as stored electric charge in the cell capacitor. Given a bias voltage of Vcc/2 on the capacitor's common node, a logical one is represented by +Vcc/2 volts across the capacitor and a logical zero is represented by −Vcc/2 volts across the capacitor.

The access transistor has a gate coupled to a word line. The word line is coupled to a plurality of memory cells, and is an extended segment of the same polysilicon used to form the access transistor's gate. The word line is physically orthogonal to the digit line.

Digit lines are typically fabricated as pairs. The digit lines are initially equilibrated at Vcc/2 volts, and all word lines are initially at zero volts, which turns off the memory cell access transistors. To read a memory cell, its word line transitions to a voltage that is at least one transistor Vth above Vcc. This elevated word line voltage level is referred to as Vccp or Vpp. When the word line voltage exceeds one Vth above the digit line equilibrate voltage (Vcc/2) and the memory cell access transistor turns on, the memory cell capacitor begins to discharge onto a digit line. Reading or accessing a memory cell results in charge being shared between the memory cell capacitor and the digit line capacitance. This sharing of charge causes the digit line voltage to either increase for a stored logic one or decrease for a stored logic zero. Ideally, the access will only modify the active digit line, leaving its complement digit line unaltered. Thus, differential voltage develops between the two digit lines.

After the cell access is complete, a sensing operation is performed by a differential sense amplifier. The sense amplifier typically includes a cross-coupled PMOS transistor pair and a cross-coupled NMOS transistor pair. A signal voltage develops between the digit line pair when the memory cell access occurs. While one digit line contains charge from the cell access, the other digit line serves as a reference for the sensing operation. The sense amplifier firing generally occurs sequentially rather than concurrently. The N-sense-amp fires first and the P-sense-amp second.

In another memory architecture, a common plate of the array of memory cell capacitors is used as a reference for the sense amplifier circuitry. In this type of architecture, the common plate is held at a predetermined voltage during operation.

The invention relates most particularly to memory architectures of a type having individual cell plate lines instead of the type where the cell plate line is the upper contact of the memory cell capacitor and all upper contacts are tied together on cell poly.

Attention is directed to the following patents, which describe dynamic cell plate sensing and which are incorporated herein by reference: U.S. Pat. No. 5,862,072 to Raad et al.; U.S. Pat. No. 5,862,089 to Raad et al.; and U.S. Pat. No. 5,821,895 to Manning. Attention is also directed to U.S. Pat. No. 5,841,691 to Fink, which relates to cell plate generators, and which is incorporated herein by reference.

Two problems exist in the individual plate line architecture. First, if both the bit line and the plate line were latched by a common sense amp, adjacent un-accessed storage cells can be corrupted. Specifically, a zero in an un-accessed storage cell could be coupled down to −DVC2. This would then turn on the access device of the un-accessed storage cell thereby leaking the zero up. Another problem which can occur in this type of architecture, is that the digit line and the plate line, upon firing of a word line, will move in opposite directions and thereby place, if allowed to, a full Vcc across the memory cell. This undesirably places a full Vcc across the nitride which serves as the cell dielectric. This can lead to breakdown and other problems which render the device inoperative.

SUMMARY OF THE INVENTION

The invention provides a method of operating a dynamic random access memory. One method includes turning on one equilibration transistor, while another equilibration transistor is off, so that a plate line equilibrates to a voltage defined by an equilibration voltage source during accessing of a memory cell.

One aspect of the invention provides a dynamic random access memory. The dynamic random access memory includes a plate line, a digit line, and a memory cell selectively coupled between the digit line and the plate line. Sense circuitry is selectively coupled to the memory cell to read the memory cell. The sense circuitry is capable of applying a first voltage from the plate line to the digit line. Equilibration circuitry selectively couples the plate line to an equilibration voltage less than the first voltage and selectively couples the digit line to the equilibration voltage. Control circuitry is configured to cause the equilibration circuitry to couple the plate line to the equilibration voltage while the memory cell is being accessed.

Another aspect of the invention provides a method of manufacturing a dynamic random access memory. The method includes providing control circuitry configured to turn on the first and second equilibration transistors to couple the digit line and plate line to the equilibration voltage source; turn off the first and second equilibration transistors, causing the digit line and plate line to float; turn on the access transistor; read the memory cell with the sense circuitry by determining the amount of charge on the capacitor; and turn on the second equilibration transistor, while the first equilibration transistor is off, so that the plate line equilibrates to the voltage defined by the equilibration voltage source.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

This invention relates to binary logic. The terms "low" and "high," as used herein, refer generally to the false and true binary logic levels, respectively. Signals are generally considered to be active when they are high, however, an asterisk (*) following the signal name indicates that the signal is negative or inverse logic (active low).

Figure 1:
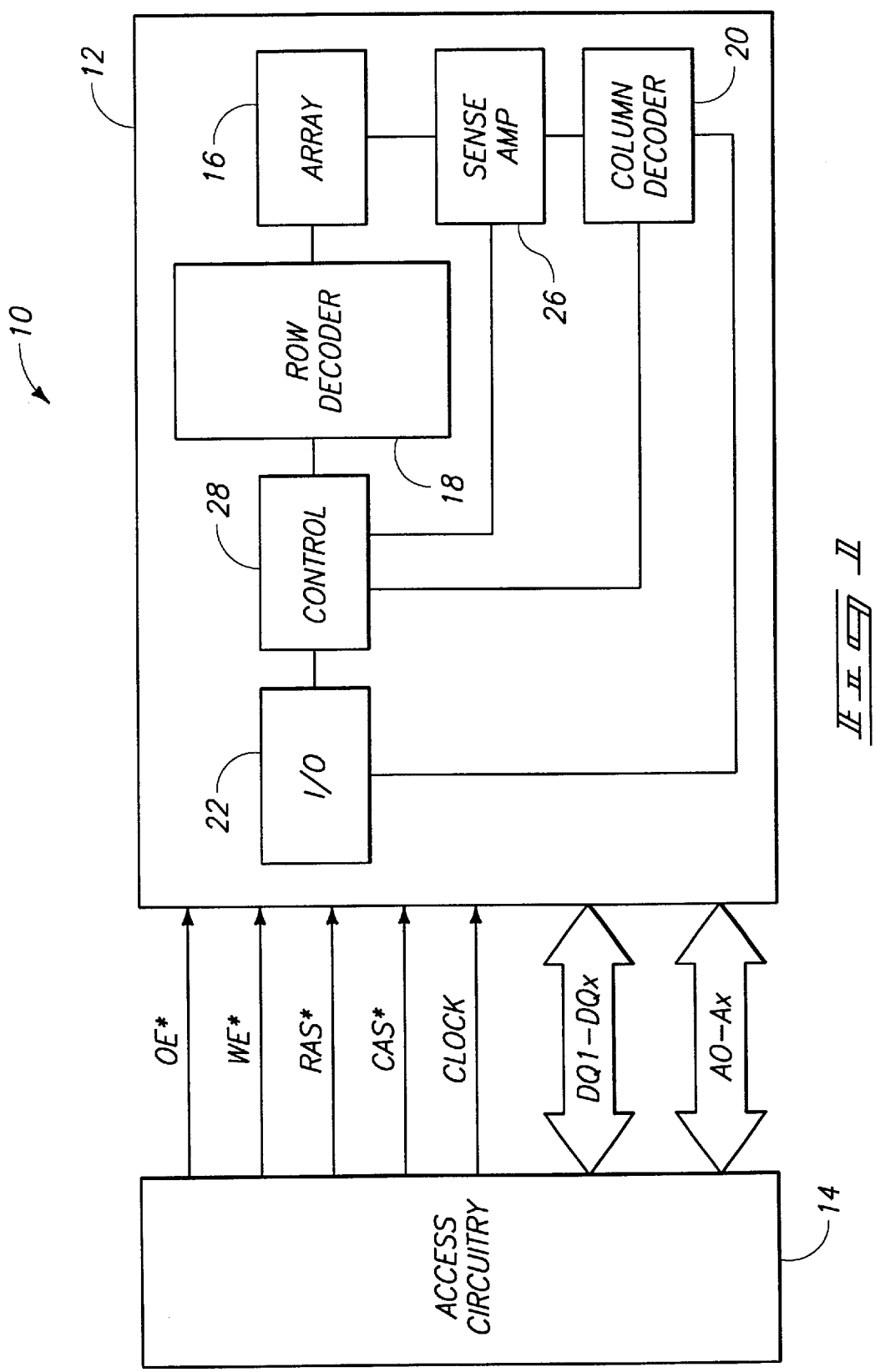
FIG. 1 is a block diagram of a system including a memory array.

FIG. 1 shows a system 10, such as a computer, including a DRAM 12 and access circuitry 14 for accessing the DRAM 12. The access circuitry 14 for accessing the DRAM 12 can be a microprocessor, memory controller, a chip set, or other external system. The DRAM 12 includes input/output connections including address lines A0–Ax via which the external access circuitry 14 accesses the DRAM.

The DRAM 12 has a memory array 16 and associated circuitry for reading from and writing to the memory array. The memory array 16 has rows and columns of individual memory cells. The DRAM 12 includes a row decoder 18 which decodes a row address from an address signal provided on address lines A0–Ax, and addresses the corresponding row of the memory array 16. The DRAM 12 also includes column decoder 20 which decodes a column address from an address signal provided on address lines A0–Ax, and addresses the corresponding column of the memory array 16.

The DRAM 12 further includes I/O circuitry 22 including a data input buffer and a data output buffer. Data stored in the memory array 16 is selectively transferred to outputs DQ1–DQx through the data output buffer. Similarly, the data input buffer is used to receive data from DQ1–DQx and transfer the data to the DRAM array.

The DRAM 12 further includes sense amplifier circuitry 26 to sense and amplify data stored on the individual memory cells of the memory array 16. The DRAM 12 also includes control circuitry 28 to monitor the memory circuit inputs and control reading and writing operations.

The DRAM 12 further includes input and output connections described as follows. Output enable (OE*) enables the output buffer of the I/O circuitry 22 of the DRAM. Write enable (WE*) is used to select either a read or write operation when accessing the DRAM. Row address strobe (RAS*) input is used to clock in the row address bits. Column address strobe (CAS*) input is used to clock in the column address bits. Address input lines A0–Ax are used to identify a row and column address. DRAM data input/output lines DQ1–DQx provide data input and output for the DRAM. A clock signal can be provided by the microprocessor for operating the memory circuit in a synchronous mode.

It will be understood that the above description of a DRAM is intended to provide a general understanding of the memory and is not a complete description of all the elements and features of a DRAM. Further, the present invention is equally applicable to other types of memory circuits, such as memory circuits of various sizes, and is not intended to be limited to the DRAM described above.

Figure 2:
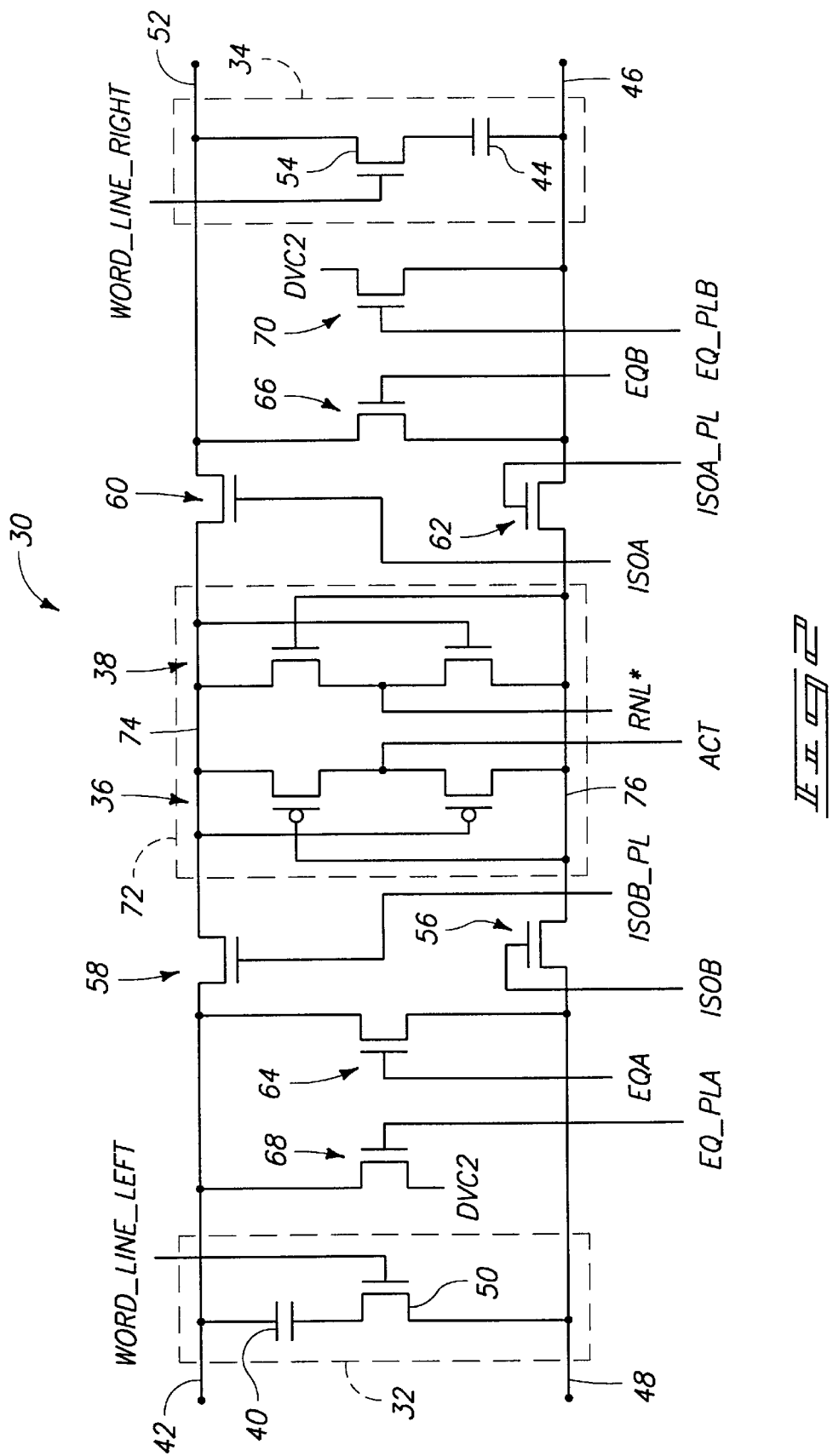
FIG. 2 is a general schematic diagram of a dynamic digit line memory array layout for a memory array of the type shown in FIG. 1.

FIG. 2 is a general schematic diagram of a dynamic digit line memory array 30. The memory array 30 has two memory cells 32 and 34 which share a common p-sense amplifier circuit 36, and an n-sense amplifier 38. Memory cell 32 includes a capacitor 40 for selectively storing a charge. The capacitor 40 has a capacitor plate coupled to a plate line 42 and another capacitor plate selectively coupled to a digit line 48 via an access transistor 50. The plate line 42 could also be referred to as a digit line (e.g. a second digit line, or a complementary digit line). Memory cell 34 has a capacitor 44 for selectively storing a charge. The capacitor 44 has a capacitor plate coupled to plate line 46 and another capacitor plate selectively coupled to a digit line 52 via an access transistor 54.

The digit lines 48 and 52, which define an array column, and the cell plate lines 42 and 46 are coupled to sense amplifier circuitry 72 through isolation transistors 56, 58, 60, and 62. Isolation transistor 56 has a gate "ISOB," isolation transistor 58 has a gate ISOB_PL, isolation transistor 60 has a gate ISOA, and isolation transistor 62 has a gate ISOA_PL.

An equilibration transistor 64 is coupled between the plate line 42 and the digit line 48, and an equilibration transistor 66 is coupled between the plate line 46 and the digit line 52. The equilibration transistor 64 has a gate EQA, and the equilibration transistor 66 has a gate EQB. An equilibration transistor 68 is coupled between the plate line 42 and an equilibration voltage DVC2, and an equilibration transistor 70 is coupled between the plate line 46 and DVC2. DVC2 is typically Vcc÷2. The equilibration transistor 68 has a gate EQ_PLA and the equilibration transistor 70 has a gate EQ_PLB. The equilibration transistors 64, 66, 68, and 70 are controlled by their respective gates.

For purposes of discussion, only memory cell 34 and the right side of FIG. 2 will be discussed. Operation of the memory cell 32 and left side of FIG. 2 is similar. When transistor 70 is turned on, by firing its gate EQ_PLB, this takes plate line 46 to equilibration voltage DVC2. When the equilibration transistor 66 is turned on, by firing its gate EQB, the transistor 66, in effect, shorts digit line 52 and plate line 46 together. When transistor 70 is turned on and transistor 66 is also turned on the voltage DVC2 is passed onto both digit line 52 and plate line 46 thereby equilibrating them to a common potential.

Isolations transistors 60 and 62 control which of the digit and plate lines are routed to sense circuitry 72. The sense circuitry 72 includes first and second nodes 74 and 76. The transistor 62, which is gated by ISOA_PL, selectively couples plate line 46 to node 76 of the sense circuitry 72. The transistor 60, which is gated by ISOA, selectively couples digit line 52 to the node 74 of the sense circuitry 76.

Figure 3:
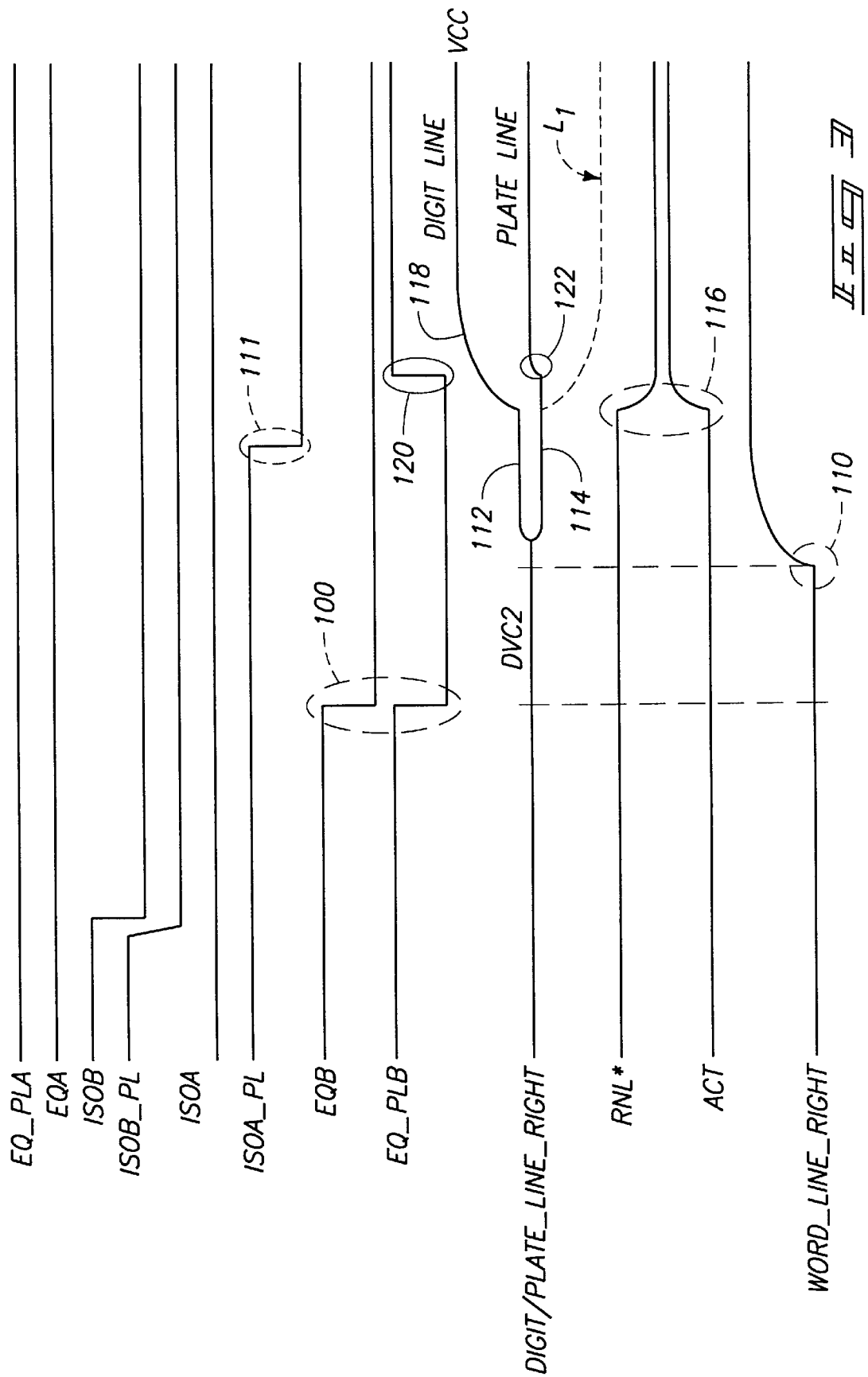
FIG. 3 is a timing diagram for the memory array layout of FIG. 2.

Refer now to both FIG. 2 and FIG. 3. To read the memory cell 34, the digit line 52 and plate line 46 are first equilibrated by the equilibration transistors. EQB and EQ_PLB are both high until a point designated event 100 (FIG. 3). This means that prior to event 100, digit line 52 and plate line 46 (FIG. 2) are equilibrated. This is also indicated in the timing diagram (FIG. 3) where DIGIT_LINE_RIGHT and PLATE_LINE_RIGHT (shown in FIG. 3 as DIGIT/PLATE_LINE_RIGHT) are shown as being at voltage level DVC2 while EQB and EQ_PLB are high. Both digit line 52 and plate line 46 are maintained at DVC2 which is the potential provided by transistor 70 (FIG. 2).

Prior to firing word line WORD LINE RIGHT at a event 110, the equilibration transistors 66 and 70 are turned off, thereby allowing digit line 52 and plate line 46 to float. This is indicated by the trailing edge of the EQB and EQ_PLB signals at 100. Now with the digit line 52 and plate line 46 floating, transistor 54 is turned on by firing WORD_LINE_RIGHT at event 110.

The transistor 54 is the access transistor for the memory cell 34. When the word line WORD_LINE_RIGHT fires, the transistor 54 is turned on and the memory cell 34 can be read from and written to. Typically, during operations, a charge, representing either a logic "1" or a logic "0" is stored on capacitor 54. Reading the memory cell 34 involves sensing the charge on the capacitor 44 after firing WORD_LINE_RIGHT. Firing WORD_LINE_RIGHT dumps the charge stored on the capacitor 44. More particularly, reading or accessing the memory cell 34 results in charge being shared between the memory cell capacitor 44 and the digit line capacitance. This sharing of charge causes the digit line voltage to increase and plate line voltage to decrease for a stored logic one or causes the digit line voltage to decrease and plate line voltage to increase for a stored logic zero. Thus, differential voltage develops between the digit line 52 and plate line 46.

Assume we are accessing and restoring for a logic one. After the transistor 54 is turned on (event 110 in FIG. 3), the voltage on digit line 52 increases, the voltage on plate line 46 decreases, then transistor 62 is turned off (event 111 in FIG. 3) after a differential voltage appears between the digit line 52 and the plate line 46. Then, the sense circuitry 72 is fired (event 116 in FIG. 3). Then, transistor 70 is turned on to equilibrate the plate line 46 (event 120 in FIG. 3).

In an alternative embodiment (not shown), the plate line 46 is equilibrated before the sense circuitry 72 is fired (e.g., event 120 occurs before event 116).

Firing of the sense circuitry 72, while transistor 54 is turned on, starts the digit line 52 moving toward Vcc (event 112 in FIG. 3). Sensing which is accomplished by sense circuitry 72 is generally an amplification of the differential voltage between the digit lines 52 and plate line 46. Sensing is necessary to properly read the cell data and to refresh the memory cell.

The sense circuitry 74 includes a cross-coupled NMOS pair of transistors defining the n-sense amplifier 38, and a cross-coupled PMOS pair of transistors defining the p-sense amplifier 36. The NMOS pair 38 has a common node labeled RNL* (n-sense latch node). Similarly, the PMOS pair 36, has a common node labeled ACT (active pull-up node).

In operation, RNL* is biased to Vcc/2, and ACT is biased to Vss or signal ground. Because the digit line 52 and plate line 46 are both initially equilibrated at, for example, Vcc/2, both transistors of NMOS pair 38 are off. Similarly, both transistors of PMOS pair 36 are off. When the memory cell 34 is accessed, a signal develops across the digit line 52 and plate line 46.

In the illustrated embodiment, the n-sense and p-sense amplifiers are fired at the same time. In an alternative embodiment, the sense amplifiers can be fired sequentially, with the n-sense amp 38 being fired first, followed by the p-sense amp 36.

The n-sense amp 38 is fired by bringing RNL* toward ground. As the voltage difference between RNL* and the digit and plate lines approaches the threshold voltage, the NMOS transistor whose gate is connected to the higher voltage line begins to conduct. This conduction occurs first in the subthreshold region and then in the saturation region as the gate-to-source voltage exceeds the threshold voltage. This conduction causes the low-voltage line to be discharged toward the RNL* voltage. Ultimately RNL* will reach ground, and the line will be brought to ground potential. Note that the other NMOS transistor will not conduct; its gate voltage is derived from the low-voltage line which is being discharged towards ground.

With one typical approach, sometime after n-sense amp 38 fires, ACT will be brought toward Vcc and activate the p-sense amp, which operates in a complementary fashion to the n-sense amp. With the low-voltage line approaching ground, there is a strong signal to drive the appropriate PMOS transistor into conduction. This conduction, again moving from subthreshold to saturation, charges the high-voltage line toward ACT, ultimately reaching Vcc, in one embodiment. Because the access transistor 54 of the memory cell remains on, the memory cell capacitor 44 is refreshed during the sensing operation. The voltage, and hence the charge, which the capacitor 44 held prior to accessing, is restored to a full level; e.g., Vcc for a logic 1, and ground for a logic 0. In an alternative embodiment, conduction to full rail voltages is not required; for example, instead of charging between ground and Vcc, a range between any two particular voltages can be employed. For example, a range between ground and Vcc/2 can be employed.

A write operation is similar to the sensing and restore operations, except that a write driver circuit included in the control circuit 28 determines what data is placed into the cell 34.

After the sense circuitry 72 is fired, a column select line (not s shown) in column decoder 20 then fires which passes the potentials of the plate line 46 and digit line 52 to I/O circuitry 22.

When the sense circuitry 72 fires, digit line 52 moves more dramatically toward Vcc as indicated at 118 in FIG. 3. At this point (after firing of the sense circuitry 72) if nothing were done, the plate line 46 would move towards ground potential as indicated in FIG. 3 by dashed line L1.

If the plate line were allowed to reach ground, that would mean that an entire full Vcc would be provided between the plate line 46 and digit line 52. This is undesirable.

Therefore, after the sense circuitry 72 is fired, transistor 70 is turned on at 120 (FIG. 3) by firing EQ_PLB. As can be seen from FIG. 3, when the transistor 70 is turned on, this enables DVC2 to be provided onto the plate line 46. Referencing now the timing diagram of FIG. 3, when this happens, rather than the plate line moving in the direction indicated by dashed line L1, it equilibrates back to DVC2 as shown at 122. By doing this, the plate line is maintained at a desirable potential relative to the digit line so that an undesired potential is not created.

This solves the problems associated with corruption of a zero in an un-accessed storage cell (see Background of the Invention).

Operation of the memory cell 32 and circuitry shown in the left side of FIG. 2 is similar to that of operation of the memory cell 54 and circuitry shown on the right side of FIG. 2, described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of operating a dynamic random access memory including sense circuitry having first and second nodes, including a digit line and a plate line, including a first isolation transistor selectively coupling the digit line to the first node of the sense circuitry, including a second isolation transistor selectively coupling the plate line to the second node of the sense circuitry, including a first equilibration transistor selectively coupling the digit line to the plate line, including a second equilibration transistor selectively coupling the plate line to an equilibration voltage source which defines an equilibration voltage, and including a memory cell having a capacitor with a first plate coupled to the plate line and with a second plate and having an access transistor selectively coupling the second plate to the digit line, the method comprising:

turning on the first and second equilibration transistors to couple the digit line and plate line to the equilibration voltage source;

turning off the first and second equilibration transistors, causing the digit line and plate line to float;

turning on the access transistor;

reading the memory cell with the sense circuitry by determining the amount of charge on the capacitor; and turning on the second equilibration transistor, while the first equilibration transistor is off, so that the plate line equilibrates to the voltage defined by the equilibration voltage source.

2. A method of operating a dynamic random access memory in accordance with claim 1 wherein the memory includes a plurality of the memory cells and is of the type wherein memory cells have individual cell plate lines.

3. A method of operating a dynamic random access memory in accordance with claim 1 wherein the sense circuitry includes an n-sense amplifier and a p-sense amplifier, and wherein reading the memory cell with the sense circuitry comprises turning on the n-sense amplifier and p-sense amplifier at the same time.

4. A method of operating a dynamic random access memory in accordance with claim 1 wherein the sense circuitry includes an n-sense amplifier and a p-sense amplifier, and wherein reading the memory cell with the sense circuitry comprises turning on the n-sense amplifier and p-sense amplifier in a sequential manner.

5. A method of operating a dynamic random access memory in accordance with claim 1 wherein turning on the second equilibration transistor comprises turning on the second equilibration transistor while the memory cell is being read by the sense circuitry.

6. A method of operating a dynamic random access memory including sense circuitry having first and second nodes, including a digit line and a plate line, including a first isolation transistor selectively coupling the digit line to the first node of the sense circuitry, including a second isolation transistor selectively coupling the plate line to the second node of the sense circuitry, including a first equilibration transistor selectively coupling the digit line to the plate line, including a second equilibration transistor selectively coupling the plate line to an equilibration voltage source which defines an equilibration voltage, and including a memory cell having a capacitor with a first plate coupled to the plate line and with a second plate and having an access transistor selectively coupling the second plate to the digit line, the method comprising:

turning on the first and second equilibration transistors to couple the digit line and plate line to the equilibration voltage source;

turning off the first and second equilibration transistors, causing the digit line and plate line to float;

turning on the access transistor;

accessing the memory cell with the sense circuitry; and turning on the second equilibration transistor, while the first equilibration transistor is off, so that the plate line equilibrates to the voltage defined by the equilibration voltage source.

7. A method of operating a dynamic random access memory in accordance with claim 6 wherein the memory includes a plurality of the memory cells and wherein memory cells have individual cell plate lines that are not tied together.

8. A method of operating a dynamic random access memory in accordance with claim 6 wherein the sense circuitry includes an n-sense amplifier and a p-sense amplifier, and wherein accessing the memory cell with the sense circuitry comprises turning on the n-sense amplifier and p-sense amplifier at the same time.

9. A method of operating a dynamic random access memory in accordance with claim 6 wherein the sense circuitry includes an n-sense amplifier and a p-sense amplifier, and wherein accessing the memory cell with the sense circuitry comprises turning on the n-sense amplifier and p-sense amplifier in a sequential manner.

10. A method of operating a dynamic random access memory in accordance with claim 6 wherein turning on the second equilibration transistor comprises turning on the second equilibration transistor while the memory cell is being read by the sense circuitry.

11. A method of manufacturing a dynamic random access memory, the method comprising:

providing a digit line and a plate line, sense circuitry having first and second nodes, a first isolation transistor selectively coupling the digit line to the first node of the sense circuitry, a second isolation transistor selectively coupling the plate line to the second node of the sense circuitry, a first equilibration transistor selectively coupling the digit line to the plate line, a second equilibration transistor selectively coupling the plate line to an equilibration voltage source which defines an equilibration voltage, a memory cell having a capacitor with a first plate coupled to the plate line and with a second plate and having an access transistor selectively coupling the second plate to the digit line, and control circuitry configured to operate in the following manner to read the memory cell:

turn on the first and second equilibration transistors to couple the digit line and plate line to the equilibration voltage source;

turn off the first and second equilibration transistors, causing the digit line and plate line to float;

turn on the access transistor;

read the memory cell with the sense circuitry by determining the amount of charge on the capacitor; and turn on the second equilibration transistor, while the first equilibration transistor is off, so that the plate line equilibrates to the voltage defined by the equilibration voltage source.

12. A method of manufacturing a dynamic random access memory in accordance with claim 11 wherein the memory includes a plurality of the memory cells and is of the type wherein memory cells have individual cell plate lines.

13. A method of manufacturing a dynamic random access memory in accordance with claim 11 wherein the sense circuitry includes an n-sense amplifier and a p-sense amplifier, and wherein reading the memory cell with the sense circuitry comprises turning on the n-sense amplifier and p-sense amplifier at the same time.

14. A method of manufacturing a dynamic random access memory in accordance with claim 11 wherein the sense circuitry includes an n-sense amplifier and a p-sense amplifier, and wherein reading the memory cell with the sense circuitry comprises turning on the n-sense amplifier and p-sense amplifier in a sequential manner.

15. A method of manufacturing a dynamic random access memory in accordance with claim 11 wherein turning on the second equilibration transistor comprises turning on the second equilibration transistor while the memory cell is being read by the sense circuitry.

16. A method of manufacturing a dynamic random access memory, the method comprising:

providing a digit line and a plate line, sense circuitry having first and second nodes, a first isolation transistor selectively coupling the digit line to the first node of the sense circuitry, a second isolation transistor selectively coupling the plate line to the second node of the sense circuitry, a first equilibration transistor selectively coupling the digit line to the plate line, a second equilibration transistor selectively coupling the plate line to an equilibration voltage source which defines an equilibration voltage, a memory cell having a capacitor with a first plate coupled to the plate line and with a second plate and having an access transistor selectively coupling the second plate to the digit line, and control circuitry configured to:

turn on the first and second equilibration transistors to couple the digit line and plate line to the equilibration voltage source;

turn off the first and second equilibration transistors, causing the digit line and plate line to float;

turn on the access transistor;

access the memory cell with the sense circuitry; and turn on the second equilibration transistor, while the first equilibration transistor is off, so that the plate line equilibrates to the voltage defined by the equilibration voltage source.

17. A method of manufacturing a dynamic random access memory in accordance with claim 16 wherein the memory includes a plurality of the memory cells and wherein memory cells have individual cell plate lines that are not tied together.

18. A method of manufacturing a dynamic random access memory in accordance with claim 16 wherein the sense circuitry includes an n-sense amplifier and a p-sense amplifier, and wherein accessing the memory cell with the sense circuitry comprises turning on the n-sense amplifier and p-sense amplifier at the same time.

19. A method of manufacturing a dynamic random access memory in accordance with claim 16 wherein the sense circuitry includes an n14 sense amplifier and a p-sense amplifier, and wherein accessing the memory cell with the sense circuitry comprises turning on the n-sense amplifier and p-sense amplifier in a sequential manner.

20. A method of manufacturing a dynamic random access memory in accordance with claim 16 wherein turning on the second equilibration transistor comprises turning on the second equilibration transistor while the memory cell is being read by the sense circuitry.

21. A dynamic random access memory comprising:

a digit line and a plate line;

sense circuitry having first and second nodes;

a first isolation transistor selectively coupling the digit line to the first node of the sense circuitry;

a second isolation transistor selectively coupling the plate line to the second node of the sense circuitry;

a first equilibration transistor selectively coupling the digit line to the plate line;

a second equilibration transistor selectively coupling the plate line to an equilibration voltage source which defines an equilibration voltage;

a memory cell having a capacitor with a first plate coupled to the plate line and with a second plate and having an access transistor selectively coupling the second plate to the digit line; and control circuitry configured to operate in the following manner to read the memory cell:

turn on the first and second equilibration transistors to couple the digit line and plate line to the equilibration voltage source;

turn off the first and second equilibration transistors, causing the digit line and plate line to float;

turn on the access transistor;

read the memory cell with the sense circuitry by determining the amount of charge on the capacitor; and turn on the second equilibration transistor, while the first equilibration transistor is off, so that the plate line equilibrates to the voltage defined by the equilibration voltage source.

22. A dynamic random access memory in accordance with claim 21 wherein the memory includes a plurality of the memory cells and wherein memory cells have individual cell plate lines.

23. A dynamic random access memory in accordance with claim 21 wherein the sense circuitry includes an n-sense amplifier and a p-sense amplifier, and wherein the control circuitry is configured to read the memory cell with the sense circuitry by turning on the n-sense amplifier and p-sense amplifier at the same time.

24. A dynamic random access memory in accordance with claim 21 wherein the sense circuitry includes an n-sense amplifier and a p-sense amplifier, and wherein the control circuitry is configured to read the memory cell with the sense circuitry by turning on the n-sense amplifier and p-sense amplifier in a sequential manner.

25. A dynamic random access memory in accordance with claim 21 wherein the control circuitry is configured to turn on the second equilibration transistor by turning on the second equilibration transistor while the memory cell is being read by the sense circuitry.

26. A dynamic random access memory comprising:

a digit line and a plate line;

sense circuitry having first and second nodes;

a first isolation transistor selectively coupling the digit line to the first node of the sense circuitry;

a second isolation transistor selectively coupling the plate line to the second node of the sense circuitry;

a first equilibration transistor selectively coupling the digit line to the plate line;

a second equilibration transistor selectively coupling the plate line to an equilibration voltage source which defines an equilibration voltage;

a memory cell having a capacitor with a first plate coupled to the plate line and with a second plate and having an access transistor selectively coupling the second plate to the digit line; and control circuitry configured to:

turn on the first and second equilibration transistors to couple the digit line and plate line to the equilibration voltage source;

turn off the first and second equilibration transistors, causing the digit line and plate line to float;

turn on the access transistor;

access the memory cell with the sense circuitry; and turn on the second equilibration transistor, while the first equilibration transistor is off, so that the plate line equilibrates to the voltage defined by the equilibration voltage source.

27. A dynamic random access memory in accordance with claim 26 wherein the memory includes a plurality of the memory cells and wherein memory cells have individual cell plate lines that are not tied together.

28. A dynamic random access memory in accordance with claim 26 wherein the sense circuitry includes an n-sense amplifier and a p-sense amplifier, and wherein the control circuitry is configured to access the memory cell with the sense circuitry by turning on the n-sense amplifier and p-sense amplifier at the same time.

29. A dynamic random access memory in accordance with claim 26 wherein the sense circuitry includes an n-sense amplifier and a p-sense amplifier, and wherein the control circuitry is configured to access the memory cell with the sense circuitry by turning on the n-sense amplifier and p-sense amplifier in a sequential manner.

30. A dynamic random access memory in accordance with claim 26 wherein the control circuitry is configured to turn on the second equilibration transistor while the memory cell is being read by the sense circuitry.

31. A dynamic random access memory comprising:

a plate line;

a digit line;

a memory cell selectively coupled between the digit line and the plate line;

sense circuitry for selectively reading the memory cell and capable of applying a voltage of Vcc from the plate line to the digit line;

equilibration circuitry selectively coupling the plate line to Vcc/2 and selectively coupling the digit line to Vcc/2, the equilibration circuitry including a first equilibration transistor selectively coupling the digit line to the plate line, and including a second equilibration transistor selectively coupling the plate line to an equilibration voltage source which defines an equilibration voltage; and control circuitry configured to cause the equilibration circuitry to couple the plate line to Vcc/2 while the memory cell is being accessed, wherein only the first and second equilibration transistors are used to selectively couple the digit line and the plate line to the equilibration voltage.

32. A dynamic random access memory in accordance with claim 31 wherein the dynamic random access memory comprises a plurality of said memory cells, respective memory cells having respective plate lines that are not all tied together.

33. A dynamic random access memory in accordance with claim 31 and further comprising access circuitry for accessing the memory cell, the access circuitry defining a word line.

34. A dynamic random access memory in accordance with claim 31 wherein the equilibration circuitry consists essentially of a first equilibration transistor selectively coupling the digit line to the plate line, and including a second equilibration transistor selectively coupling the plate line to an equilibration voltage source which defines an equilibration voltage.

35. A dynamic random access memory in accordance with claim 31 wherein the sense circuitry comprises an n-sense amplifier selectively coupled between the digit line and the plate line and a p-sense amplifier selectively coupled between the digit line and the plate line.

36. A dynamic random access memory in accordance with claim 35 wherein the control circuitry causes the n-sense amplifier and the p-sense amplifier to operate simultaneously during accessing of the memory cell.

37. A dynamic random access memory comprising:

a plate line;

a digit line;

a memory cell selectively coupled between the digit line and the plate line;

sense circuitry selectively coupled to the memory cell to read the memory cell and capable of applying a first voltage from the plate line to the digit line;

equilibration circuitry selectively coupling the plate line to an equilibration voltage less than the first voltage and selectively coupling the digit line to the equilibration voltage, the equilibration circuitry including a first equilibration transistor selectively coupling the digit line to the plate line, and including a second equilibration transistor selectively coupling the plate line to an equilibration voltage source which defines an equilibration voltage; and control circuitry configured to cause the equilibration circuitry to couple the plate line to the equilibration voltage while the memory cell is being accessed, wherein only the first and second equilibration transistors are used to selectively couple the digit line and the plate line to the equilibration voltage.

38. A dynamic random access memory in accordance with claim 37 wherein the equilibration voltage is half the first voltage.

39. A dynamic random access memory in accordance with claim 37 and further comprising a second memory cell, and wherein the sense circuitry is selectively coupled to the second memory cell.

40. A dynamic random access memory in accordance with claim 37 wherein the sense circuitry includes an n-sense amplifier selectively coupled between the plate line and the digit line, and a p-sense amplifier selectively coupled between the plate line and the digit line, and wherein the control circuitry causes the n-sense amplifier and the p-sense amplifier to operate sequentially during accessing of the memory cell.

41. A dynamic random access memory in accordance with claim 37 wherein the sense circuitry includes an n-sense amplifier selectively coupled between the plate line and the digit line, and a p-sense amplifier selectively coupled between the plate line and the digit line, and wherein the control circuitry causes the n-sense amplifier and the p-sense amplifier to operate simultaneously during accessing of the memory cell.

42. A dynamic random access memory in accordance with claim 37 wherein the equilibration circuitry consists essentially of a first equilibration transistor selectively coupling the digit line to the plate line, and including a second equilibration transistor selectively coupling the plate line to an equilibration voltage source which defines an equilibration voltage.

* * * * *

UNITED STATES PATENT AND TRADEMARK OFFICE
CERTIFICATE OF CORRECTION

PATENT NO. : 6,246,604 B1
DATED : June 12, 2001
INVENTOR(S) : Tyler A. Lowrey

It is certified that error appears in the above-identified patent and that said Letters Patent is hereby corrected as shown below:

Column 4,
Line 63, replace "WORD LINE RIGHT" with -- WORD_LINE_RIGHT --.

Column 6,
Line 26, replace "(not s shown)" with -- (not shown) --.

Column 9,
Line 51, replace "n 14 sense" with -- n-sense --.

Signed and Sealed this

Twenty-second Day of January, 2002

Attest:

JAMES E. ROGAN
Attesting Officer          Director of the United States Patent and Trademark Office